(12) United States Patent
Mayer et al.

(10) Patent No.: US 9,627,894 B1
(45) Date of Patent: Apr. 18, 2017

(54) MODULAR SOLAR INVERTER

(71) Applicant: SolarCity Corporation, San Mateo, CA (US)

(72) Inventors: Alex Mayer, San Francisco, CA (US); Remy Labesque, San Francisco, CA (US)

(73) Assignee: SolarCity Corporation, San Mateo, CA (US)

( * ) Notice: Subject to any disclaimer, the term of this patent is extended or adjusted under 35 U.S.C. 154(b) by 0 days.

(21) Appl. No.: 15/092,555

(22) Filed: Apr. 6, 2016

(51) Int. Cl.
   *H02J 3/38* (2006.01)
   *H02M 1/00* (2006.01)
   *H02S 40/34* (2014.01)
   *H02M 7/537* (2006.01)

(52) U.S. Cl.
   CPC .............. *H02J 3/383* (2013.01); *H02J 3/387* (2013.01); *H02M 7/537* (2013.01)

(58) Field of Classification Search
   CPC . H02J 3/38; H02M 1/00; H02M 7/003; H02S 40/34
   USPC ......................................................... 363/146
   See application file for complete search history.

(56) References Cited

U.S. PATENT DOCUMENTS

| | | | | |
|---|---|---|---|---|
| 6,396,170 B1* | 5/2002 | Laufenberg | ............. | H02J 9/062 307/43 |
| 8,786,133 B2 | 7/2014 | Cheng et al. | | |
| 9,118,213 B2 | 8/2015 | Koehl | | |
| 2008/0164766 A1* | 7/2008 | Adest | ........................ | H02J 1/12 307/80 |
| 2008/0228970 A1* | 9/2008 | Schneider | ............. | G06F 13/409 710/104 |
| 2010/0264744 A1 | 10/2010 | Schmitt et al. | | |
| 2011/0109298 A1* | 5/2011 | Jones | .................... | H02M 7/493 323/361 |
| 2014/0169053 A1 | 6/2014 | Ilic et al. | | |

OTHER PUBLICATIONS

"The APsystems Microinverter," Webite of APsystems USA, 2016. Retrieved from the Internet on Apr. 6, 2016, at https://usa.apsystems.com/solar-microinverters/#tab-id-3, 5 pages.
"Solar Photovoltaic (PV) Inverters," Website of AEG Power Solutions, 2016. Retrieved from the internet at https://www.aegps.com/en/products/solar-inverters/, 3 pages.
"MPV.SYSTEM150: Modular Solar and Fuel Cell Inverter," Website of AEG Power Solutions, 2016. Retrieved from the internet at https://www.aegps.com/en/products/solar-inverters/mpv/, 2 pages.

* cited by examiner

*Primary Examiner* — Rexford Barnie
*Assistant Examiner* — Thai Tran
(74) *Attorney, Agent, or Firm* — Kilpatrick Townsend & Stockton LLP

(57) ABSTRACT

Embodiments herein disclose an apparatus for a modular PV system. The apparatus may include a wire box coupled to an alternating current (AC) system through an AC bus and to both a first direct current (DC) power source and a second DC power source through a conduit; a first inverter having a first chassis attached to the wire box and being coupled to the first DC power source through the wire box, the first inverter comprising a first pass-through channel and a second pass-through channel; and a second inverter having a second chassis attached to the first chassis and being coupled to the second DC power source through the first pass-through channel and the wire box, wherein the first chassis and the second chassis are separate chassis.

20 Claims, 9 Drawing Sheets

MODULAR SOLAR INVERTER

BACKGROUND

In recent years, climate change concerns, reductions in costs, governmental initiatives, and other factors have driven a rapid rise in the installation of renewable energy generation (EG) systems (i.e., systems that generate energy using renewable resources such as solar, wind, hydropower, etc.) at residential and non-residential sites. Solar photovoltaic (PV) systems, in particular, have been very popular EG systems.

PV systems include PV modules that generate direct current (DC) power from photons emitted from the sun. When strung together in series, the string of PV modules will have a high DC voltage equal to the sum of the PV module DC voltage. In systems that utilize centralized or so-called string inverters, the combined DC power output of a group of serially connected modules is converted into alternating current (AC) power by the inverter for use by a load, such as a residential appliance, commercial tool, the utility grid and the like. String and central inverters can take one or more PV module strings as input in order to increase the amount of available DC power to converter into AC power. The inverter must be matched to the DC and AC power in order to maximize inversion efficiency. However, manufacturing costs prevent string inverters from being able to be precisely matched to the power out of a particular array. They often come in integer sizes such as 5 kW, 10 kW, etc., where that number represents the maximum capacity of the inverter. As a result, the particular string inverter used on any particular job may have quite a bit of excess capacity for which a return on investment is never achieved. Therefore, the one size fits all or relatively small numbers of sizes fits all approach to string inverters results in unnecessarily high hardware costs. One solution to overcome this limitation is through the use of micro inverters instead of string and central inverters. These micro inverters convert the DC power output of one to four modules into AC power within the string. This eliminates the sizing issue from above, but leads to increased equipment costs, maintenance complexity, and redundancy. Therefore, there exists a need for an inverter system that combines the lower cost of a string inverter with the efficient inverter to PV module sizing of the micro inverter.

BRIEF SUMMARY

Embodiments herein disclose an apparatus for a modular PV system. In embodiments, the apparatus may include a wire box coupled to an alternating current (AC) system through an AC bus and to both a first direct current (DC) power source and a second DC power source through a conduit; a first inverter having a first chassis attached to the wire box and being coupled to the first DC power source through the wire box, the first inverter comprising a first pass-through channel and a second pass-through channel electrically isolated from the first pass-through channel, wherein the first inverter is configured to convert DC power generated from the first DC power source into AC power that is outputted into the AC bus; and a second inverter having a second chassis attached to the first chassis and being coupled to the second DC power source through the first pass-through channel and the wire box, the second inverter comprising a third pass-through channel configured to allow a third inverter to be coupled to the wire box through the third pass-through channel and the second pass-through channel, wherein the second inverter is configured to convert DC power generated from the second DC power source into AC power that is outputted into the AC bus, and wherein the first chassis and the second chassis are separate chassis.

The second and third pass-through channels may form a single pass-through channel. In embodiments, the first, second, and third pass-through channels are formed of conductive lines on a PCB having contacts disposed at opposite ends of each conductive lines. The conductive lines may comprise a positive and a negative conductive line. In certain embodiments, the first, second, and third pass-through channels may be formed of separate, electrically-insulated conductive wires having contacts disposed at opposite ends of each conductive wire. The second pass-through channel may be formed of a conductive wire that runs through corresponding holes in the first chassis. In embodiments, the apparatus may further include an adapter disposed between the first chassis and the second chassis, the adapter may be configured to route DC power from the second-pass-through channel to the third pass-through channel and/or to the second inverter via connection to the first pass-through channel. In other words, if the third pass through channel is utilized, the second inverter must also be utilized so the adapter must allow at least one pass through connection from the previous chassis to connect directly to the second inverter.

The first chassis may have a first direct current (DC) inlet, a first DC outlet, a first AC inlet and a first AC outlet, and the second chassis has a second DC inlet, a second DC outlet, a second AC inlet, and a second AC outlet. The first pass-through channel may be coupled to the first DC inlet and the first DC outlet. In embodiments, DC power may flow into the first chassis from the first DC power source through the first DC inlet, and AC power may flow out of the first chassis from the first AC outlet. In some embodiments, DC power may flow into the second chassis from the second DC power source through the second DC inlet, and AC power may flow out of the second chassis from the second AC outlet. The first and second chassis may include a switch for coupling first and second inverters to first and second DC power sources, respectively. The switch may be a manual switch or a computer-controlled switch. In embodiments, the first and second chassis are field configurable. In embodiments, the AC system includes a main panel, load center, substation, and/or a transformer. In certain embodiments, the first and second inverters include single-stage inverters. The first and second inverters may include multi-stage inverters. In other embodiments, the first and second inverters may include single-stage and multi-stage inverters.

In embodiments, a photovoltaic (PV) power generation system may include a PV array having an electrical output divided into first direct current (DC) power source and a second DC power source; and a modular inverter system. The modular inverter system may include a wire box coupled to an alternating current (AC) system through an AC bus and to both the first DC power source and the second DC power source; a first inverter having a first chassis attached to the wire box and being coupled to the first DC power source through the wire box, the first inverter comprising a first pass-through channel and a second pass-through channel separate from the first pass-through channel, wherein the first inverter is configured to convert DC power generated from the first DC power source into AC power that is outputted into the AC bus; and a second inverter having a second chassis attached to the first chassis and being coupled to the second DC power source through the first pass-through channel and the wire box, the second inverter comprising a third pass-through channel configured to allow a third inverter to be coupled to the wire box through the third pass-through channel and the second pass-through channel, wherein the second inverter is configured to convert DC power generated from the second DC power source into AC power that is outputted into the AC bus, and wherein the first chassis and the second chassis are separate chassis.

The first, second, and third pass-through channels may be formed of conductive lines on a PCB having contacts disposed at opposite ends of each conductive lines. In embodiments, the system may further include an energy storage device. In some embodiments, the first, second, and third pass-through channels are formed of separate, electrically-insulated conductive wires having contacts disposed at opposite ends of each conductive wire. The system may further include an adapter disposed between the first chassis and the second chassis, the adapter configured to route DC power from the second-pass-through channel to the third pass-through channel as well as from the first pass-through channel to the second inverter.

In embodiments, a method for converting power for an energy generation system includes receiving, at a wire box, first and second DC power inputs; performing maximum power point tracking (MPPT) with respective first and second MPPT circuits on the first and second power inputs; connecting an output of the first MPPT circuit to a first DC inlet of a first inverter chassis; inverting the output of the first MPPT circuit with a first inverter in the first inverter chassis; connecting an output of the second MPPT circuit to a first pass-through circuit of the first inverter chassis; receiving, at a second DC inlet of a second inverter chassis, the DC power from the first pass-through channel in the first inverter chassis; inverting the output of the second MPPT circuit with a second inverter in the second inverter channel; and routing the DC power through at least a portion of a second pass-through channel in the second inverter chassis to an inverter in the second inverter chassis.

The method may further include combining the output of the first and second inverters onto a common AC bus that is also connected to a terminal in the wire box.

A better understanding of the nature and advantages of embodiments of the present invention may be gained with reference to the following detailed description and the accompanying drawings.

DETAILED DESCRIPTION

Embodiments for modular inverters in PV systems are described. The modular inverters are constructed to each have an individual chassis that can attach to other inverter chassis to form an inverter stack, which may be implemented in a PV system. Each inverter may have pass-through channels that allow power to be routed through its chassis to be received by another inverter in the inverter stack. The inverter stack is field-configurable, meaning inverters may be added to, or removed from, the stack at the installation site, i.e., after the inverters have been manufactured and during/after installation of the PV system, to specifically tailor the inverter stack to support PV modules in a PV system. Also, common wiring functions and MPPT are separate out of the inverter and supplied in a separate interface box shared by all modular inverters. In order to appreciate the aspects of modular inverters, a broad overview of PV systems in general is briefly discussed.

I. Photovoltaic Energy Generation System

Figure 1A:
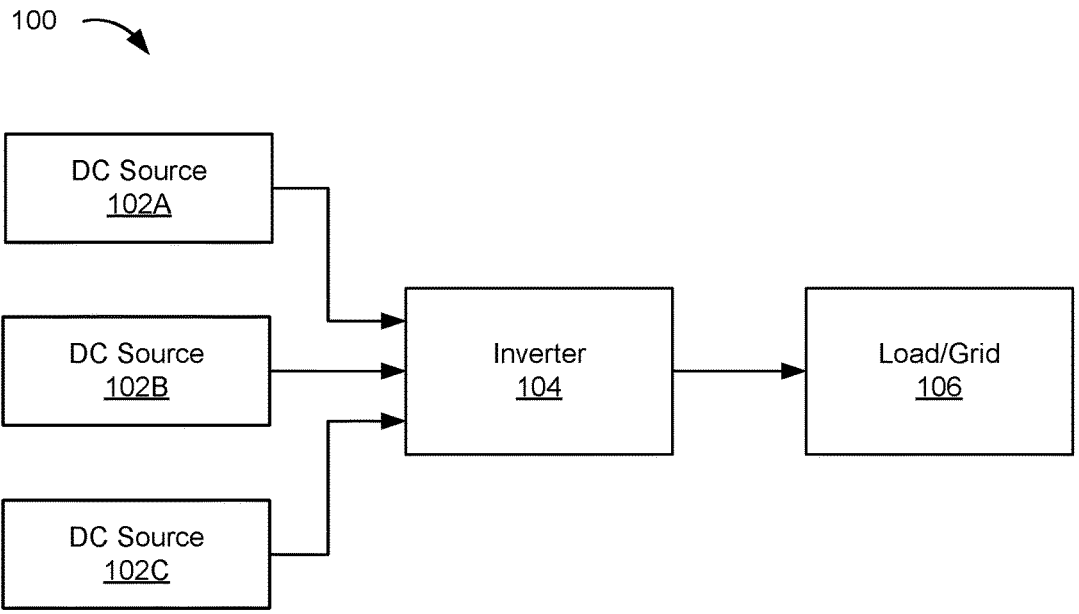
FIG. 1A is a simplified block diagram illustrating a PV system including an inverter and a plurality of DC power sources.

FIG. 1A is a simplified diagram illustrating a generic PV system 100 including inverter 104 and plurality of DC power sources 102A-102C. DC power sources 102A-102C may be devices for providing DC power to inverter 104 such as PV modules, batteries, fuel cells, and the like. DC power is received by inverter 104 and then converted into AC power for use by a load 106, inputted back into the utility grid, or inputted into a battery through AC coupling. Some exemplary loads include typical household appliances, consumer electronic devices, commercial machinery, and any other electronic device that consumes power.

Figure 1B:
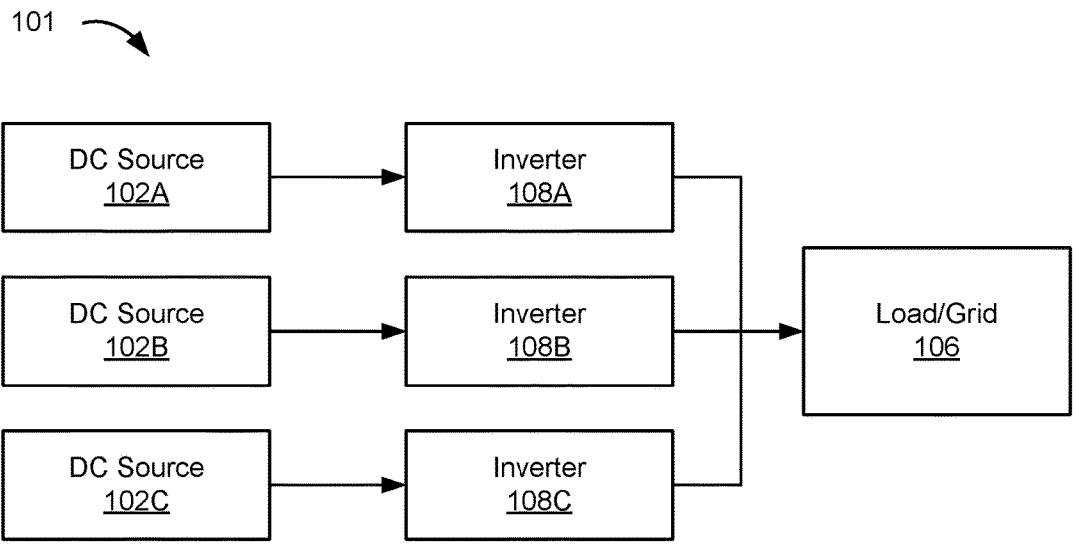
FIG. 1B is a simplified block diagram illustrating a PV system including a plurality of inverters and a plurality of DC power sources.
Figure 2:
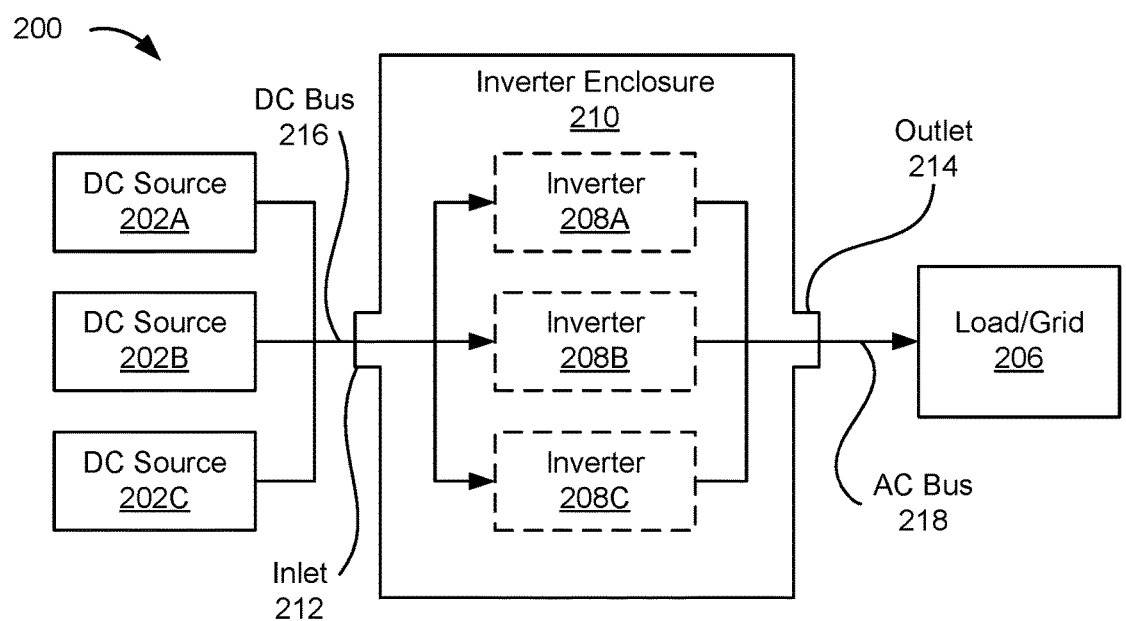
FIG. 2 is a simplified block diagram illustrating a PV system including a plurality of inverters housed in a single inverter enclosure.

In PV systems where DC sources output a substantially high amount of power, such as PV module arrays for large residential or commercial applications, one inverter may not be enough to support the total power outputted by the DC sources. As a result, several inverters may be implemented to ensure successful operation of such PV systems. This may exacerbate the problem of excess capacity. FIG. 1B illustrates an exemplary PV system 101 where DC power sources 102A-102C output an amount of DC power that requires three inverters 108A-108C. Each inverter 108A-108C may be configured to convert DC power generated by a respective DC source 102A-102C (e.g., one string of PV modules) into AC power. Converted AC power may then be combined into an AC bus and outputted to specific loads and/or to the grid 106. Typically, inverters 108A-108C are disposed within a single housing to protect them from the environment when installed at a site, as shown in FIG. 2. However, in some cases, individual discrete inverter enclosures may be used.

FIG. 2 illustrates an exemplary installation configuration 200 where inverters 208A-208C are housed in single inverter enclosure 210, which may be formed of a single chassis containing an inlet 212 and an outlet 214. Outputs of DC sources 202A-202C may combine into a DC bus 216 and be inputted into inverter enclosure 210 through inlet 212. Inlet 212 may be an opening through which a cable for DC bus 216 may insert to allow coupling between DC sources 202A-202C and inverters 208A-208C. Once inverters 208A-208C convert DC power from DC bus 216 into AC power, each respective output of AC power may be combined into AC bus 218 and then outputted through outlet 214 to provide AC power to load/grid 206.

Because inverters 208A-208C are housed within single inverter enclosure 210, the overall size of inverter enclosure 210 must be substantially large. Often, such inverter enclosures are too large to be mounted on a side of a building containing the PV system, and as a result, such inverter enclosures are mounted on the ground beside or near the building. Additionally, such inverter enclosures are typically built according to a predetermined specification and thus cannot be reconfigured to house more or less inverters once it has been manufactured and installed. Moreover, the large size results in higher installation and material costs.

Embodiments herein avoid these shortcomings with the use of modular inverters having separate chassis that are stackable. When stacked, the modular inverters form a modular inverter system that is field configurable even after manufacturing at a client site.

II. Modular Solar Inverter System

Figure 3:
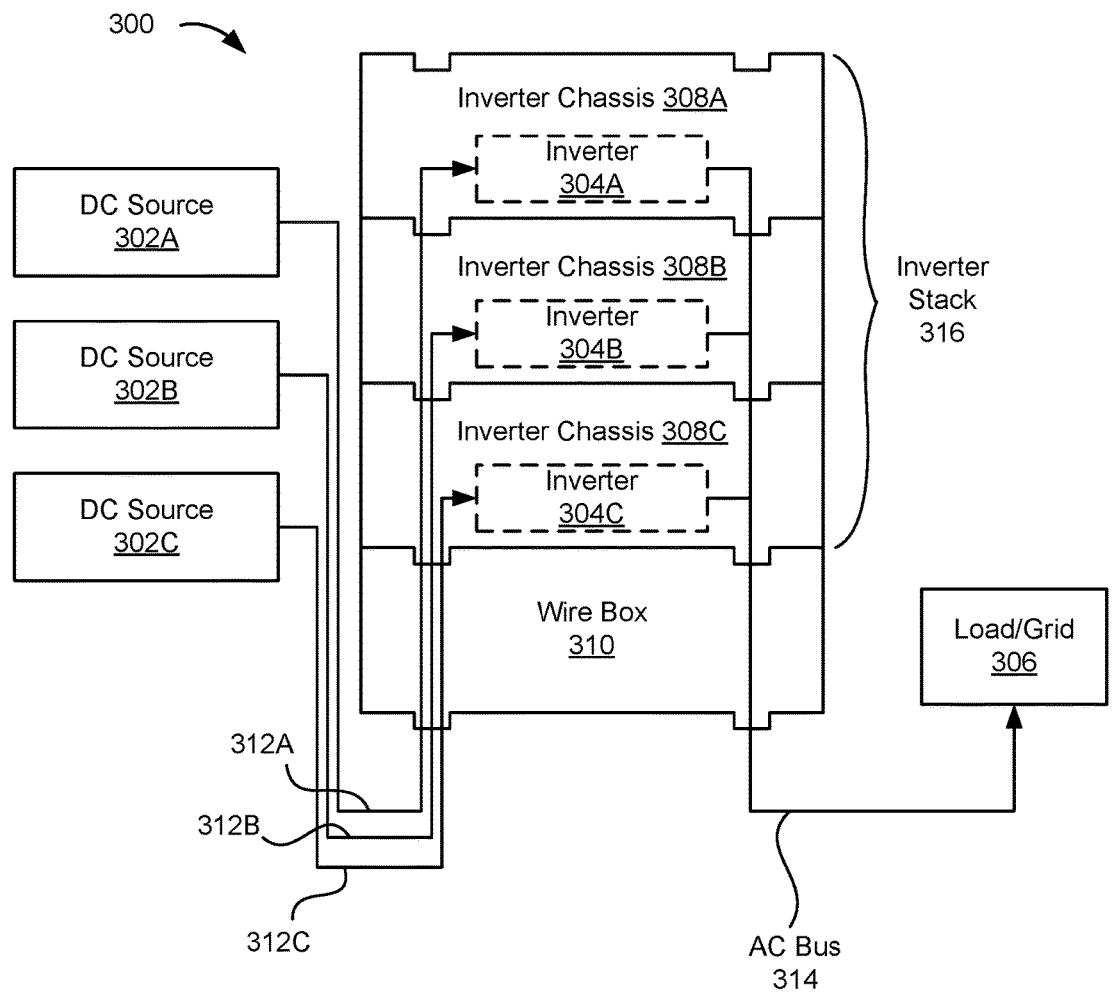
FIG. 3 is a simplified block diagram illustrating a PV system including a modular inverter system, according to embodiments of the present invention.

FIG. 3 illustrates an exemplary modular inverter system 300 according to embodiments of the present invention. As shown, DC sources 302A-302C provide DC power to respective inverters 304A-304C that are configured to convert the DC power into AC power and output the AC power onto an AC bus 314 for use by load/grid 306 via an AC system, which may include a main panel, load center, transformer, substation, or any other suitable electrical component for supplying/receiving AC power. DC sources 302A-302C may include PV arrays and/or energy storage devices, such as batteries or fuel cells.

A notable difference between modular inverter system 300 and installation configuration 200 is that inverters 304A-304C of modular inverter system 300 each have their own respective chassis 308A-308C instead of sharing a single inverter enclosure, e.g. inverter enclosure 210 in FIG. 2. Inverter chassis 308A-308C may be stacked one upon another to form an inverter stack 316, which may be stacked on a common interface box such as wire box 310. Another notable difference is that, outputs 312A-312C of DC power sources 302A-302C, respectively, are not combined onto a DC bus, but are instead routed to respective inverters 304A-304C through separate connection routes in a conduit, a bussing in the inverter chassis, or any other suitable passageway within the spirit and scope of the present invention.

Each inverter chassis is configured to enable inverters to be added to or removed from inverter stack 316 after manufacturing and during/after installation at a customer site. For instance, inverter chassis 308A is configured to allow an additional inverter to be added to inverter stack 316 by merely coupling the additional inverter with an upper interface of inverter chassis 308A. Removal of an inverter may be just as simple. As an example, each inverter chassis is configured to removal from inverter stack 316 by simply separating the desired inverter from inverter stack 316. The ease and simplicity of modifying inverter stack 316 allows modular inverter system 300 to be field configurable. This also enables the installer to utilize only so much inverter capacity as is necessary to deal with the number and size of the strings associated with any given PV system.

According to embodiments of the present invention, each inverter chassis may contain pass-through channels for enabling field configurability by allowing outputs 312A-312C to be provided to certain inverters through intermediate inverter chassis. For instance, pass-through channels in inverter chassis 308C may allow outputs 312A and 312B from DC sources 302A and 302B, respectively, to be provided to inverters 304A and 304B. In this example, inverter chassis 308C is an intermediate inverter chassis for both inverters 304A and 304B, and inverter chassis 304B is an intermediate inverter chassis for inverter 304A.

Although FIG. 3 illustrates a modular inverter system 300 having only three inverters 304A-304C for inverter stack 316, embodiments are not limited to such configurations. Other embodiments may have more or less inverters and inverter chassis depending upon design and/or requirements. For example, modular inverter system 300 may have additional inverters that are added upon inverter stack 316 by connecting them above inverter chassis 308A, between two inverter chassis, or between inverter chassis 308C and wire box 310. This may be particularly useful if the customer decides to increase the size of the system at some point in the future. Alternatively, modular inverter system 300 may have less inverters than shown in FIG. 3 by removing one or more inverter chassis from inverter stack 316. The ease and simplicity of adding and subtracting inverters from inverter stack 316 enables field configurability, lowers installation cost, reduces lost power due to a failure, and reduces time required to repair following a fault. In embodiments, each inverter 304A-304C may be a single-stage inverter or a multi-stage inverter. In other embodiments, inverters 304A-304C may include single-stage and multi-stage inverters. It is to be appreciated that any suitable inverter can be implemented in modular inverter system 300 without departing from the spirit and scope of the present invention.

A. Modular Inverter

Figure 4:
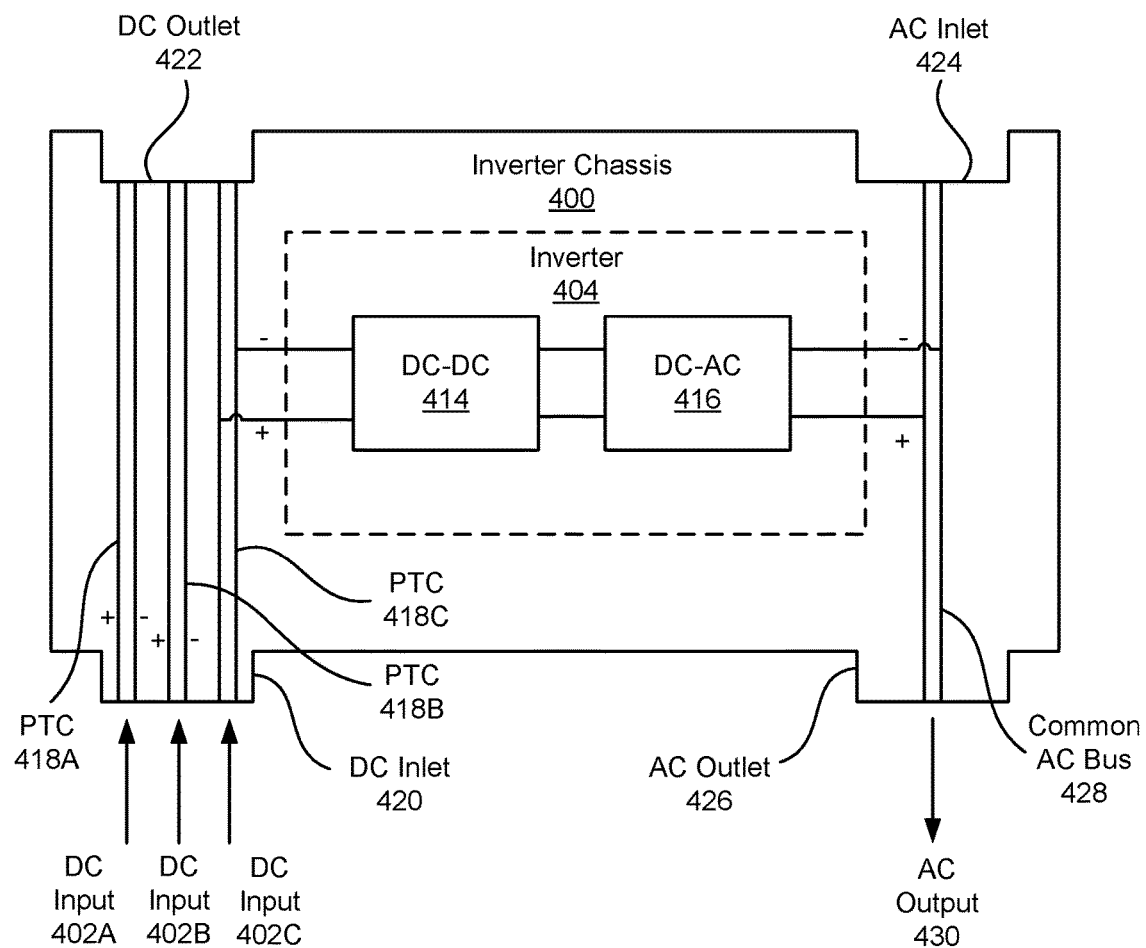
FIG. 4 is a simplified block diagram illustrating an inverter chassis of a modular inverter, according to embodiments of the present invention.

FIG. 4 illustrates an exemplary inverter chassis 400 according to embodiments of the present invention. Inverter chassis 400 may include DC inlet 420 for inputting DC power from DC sources, such as DC power sources 302A-302C in FIG. 3 which may be a PV module, battery, fuel cell, or any other suitable DC power source. For purposes of explanation from the perspective of inverter chassis 400, DC power entering inverter chassis 400 is hereinafter referred to as inputs, such as DC inputs 402A-402C for different DC power sources. DC inputs 402A-402C may enter through DC inlet 420 and conduct through respective pass-through channels (PTC) 418A-418C configured for route power to DC outlet 422 through inverter chassis 400.

Pass-through channels 418A-418C may be configured to route power from DC inlet 420 to DC outlet 422 through electrically isolated paths. As an example, pass-through channels 418A-418C may be formed of separate conductive lines on a printed circuit board (PCB) that route power from DC inlet 420 to DC outlet 422. Conductive pads (not shown) disposed at respective positions in DC inlet 420 may provide an avenue through which DC power may conduct into pass-through channels 418A-418C. Likewise, corresponding conductive pads (not shown) disposed at respective positions in DC outlet 422 may provide an avenue through which DC power may conduct out of pass-through channels 418A-418C and into another inverter chassis disposed above inverter chassis 400, as will be discussed further herein. In embodiments, pass-through channels 418A-418C may each be formed of two separate conductive lines: a positive terminal line and a negative terminal line, for routing power from a DC source.

In other embodiments, pass-through channels 418A-418C may each be formed of separate, electrically isolated positive and negative conductive wires with corresponding contacts on either end of the conductive wires for routing power through inverter chassis 400. In yet other embodiments, pass-through channels 418A-418C may be physical conduit tunnels, or a corresponding pair of openings in inverter chassis 400, through which positive and negative electrically isolated wires may thread. The isolated wires may run through respective conduit holes disposed at DC inlet 420 and DC outlet 422 to route power from DC inlet 420 to DC outlet 422. It is to be appreciated that any other method of routing power as a pass-through channel that does not depart from the spirit and scope of the present invention is envisioned herein.

The exemplary inverter chassis 400 in FIG. 4 illustrates an instance where inverter chassis 400 has three inputs, where each input may correspond to a respective DC source. However, embodiments are not limited to inverter chassis with only three pass-through channels. Some embodiments may have inverter chassis with more than three pass-through channels and other embodiments may have inverter chassis with less than three pass-through channels. The number of pass-through channels may be determined by system design. More DC sources may require more pass-through channels, and less DC sources may require less pass-through channels. In some embodiments there may be more pass-through channels than DC sources, which may result in some pass-through channels not being utilized to route power through the inverter chassis.

In embodiments, at least one of the pass-through channels may be tapped to route at least some of the DC power out of the pass-through channel and into inverter 404. For instance, as shown in FIG. 4, inverter 404 may tap into pass-through channel 418C to route DC power provided by DC source as DC input 402C. Inverter 404 may convert the DC power into AC power through one or more converters. As an example, inverter 404 may include DC-to-DC boost converter 414 and DC-to-AC converter 416. DC-to-DC boost converter 414 may receive DC power from pass-through channel 418C and step up the voltage of the DC power to output a greater DC power than what was originally inputted into DC-to-DC boost converter 414. The stepped up voltage may then be inputted into DC-to-AC converter 416 that is configured to convert the inputted DC power to AC power.

Outputted AC power may be outputted into common AC bus 428, which may provide outputted AC power to a load, into a utility grid, such as load/grid 306 in FIG. 3, or into an AC coupled battery system. In some embodiments, common AC bus 428 may also contain outputted AC power from other inverters in an inverter stack, such as inverter stack 316 in FIG. 3, in which case the AC power outputted by inverter 404 may be combined with existing AC power in common AC bus 428. The AC power from other inverters may enter into common AC bus 428 via AC inlet 424 and exit out of common AC bus 428 via AC outlet 426 as AC output 430. Similar to pass-through channels 418A-418C, common AC bus 428 may be formed of any suitable power routing mechanism, such as a pair of positive and negative conductive lines on a PCB with corresponding contacts at either end of the conductive lines, electrically isolated positive and negative wires with corresponding contacts at either end of the wires, or conduits through which electrically isolated positive and negative wires may be threaded.

Although FIG. 4 illustrates AC bus 428 as being formed of two power lines, embodiments are not limited to such configurations. AC bus 428 may be formed of more than two power lines in other embodiments. For instance, AC bus 428 may be formed of three conductive lines in some embodiments, and AC bus 428 may be formed of four conductive lines in other embodiments.

Inverter stack 316 may be configured with an arrangement of inverters suitable to support an outputted power level of DC sources 302A-302C. Each inverter 304A-304C may be configured to support a specific power level. The power level capable of being supported by inverter stack 316 as a whole may be determined by a sum of the power levels of the individual inverters 304A-304C. As an example, if inverter 304A, 304B, and 304C are configured to support power levels of 2.88 kW, 2.88 kW, and 1.91 kW, respectively, inverter stack 316 may be able to support a power level of 7.67 kW (2.88 kW+2.88 kW+1.91 kW). It is to be appreciated that the inverters may be arranged in any other combination suitable to support a power level outputted by the DC sources.

In embodiments, the structure and configuration of pass-through channels 418A-418C and common AC bus 428 enable devices coupled to one end of inverter chassis 400 to send and/or receive power from devices coupled to the opposite end of inverter chassis 400. By enabling this coupling, a wide variety of inverter combinations can be mated with one another in an inverter stack while having an electrical path for coupling to respective DC sources, as will be discussed further herein.

B. Interworking of Mated Modular Inverters

FIGS. 5-8 illustrate some exemplary ways modular inverters interact with one another in an inverter stack to enable modularity and field configurability according to embodiments of the present invention. The embodiments illustrated in FIGS. 5-8 show how only two modular inverters may be coupled together for ease of discussion. However, it is to be understood that embodiments are not limited to modular inverter systems with only two inverters, and that the principles, functions, and features discussed with respect to two-inverter modular inverter systems may be implemented in modular inverter systems having more than two modular inverters. As will be appreciated through the discussion of FIGS. 5-8, the existence of pass-through channels and the ease of connectivity between modular inverters in an inverter stack enables more or less inverters to be coupled together after the modular inverters have been manufactured, thereby enabling field configurability.

1. Coupling by Design

Figure 5:
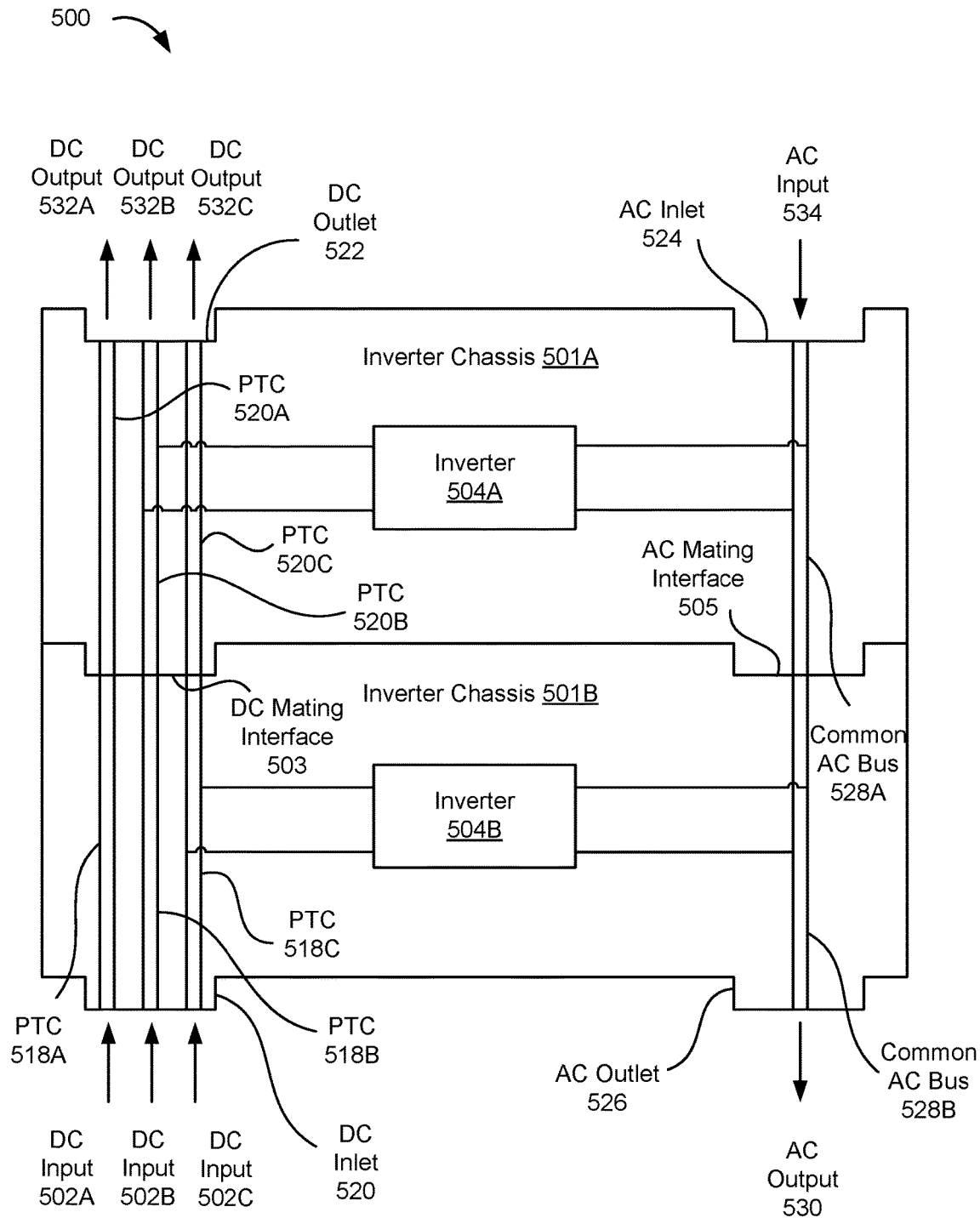
FIG. 5 is a simplified block diagram illustrating a modular inverter stack where inverters are coupled to pass-through channels by design, according to embodiments of the present invention.

FIG. 5 illustrates an exemplary inverter stack 500 where modular inverters are coupled to respective pass-through channels by design and where inverter chassis are directly mated with one another according to embodiments of the present invention. As shown, inverter chassis 501A may be directly coupled to inverter chassis 501B such that pass-through channels 518A-518C in inverter chasses 501B are coupled to respective pass-through channels 520A-520C in inverter chassis 501A, and that common AC bus 528B in inverter chasses 501B is coupled to common AC bus 528A in inverter chassis 501A. Contacts (not shown) positioned at a DC outlet of inverter chassis 501B may couple to respective contacts (not shown) positioned at a DC inlet of inverter chassis 501A at DC mating surface 503 to enable DC power to be routed between inverter chassis 501A and 501B. Additionally, contacts (not shown) positioned at AC outlet of inverter chassis 501A may couple to respective contacts (not shown) positioned at AC inlet of inverter chassis 501B at AC mating surface 505 to enable AC power to be routed between inverter chassis 501A and 501B.

In embodiments, inverters 504A and 504B may each be coupled to a pass-through channel to receive DC power from a DC source. With respect to the example illustrated in FIG. 5, inverter 504B may be coupled to pass-through channel 518C to receive DC input 502C, and inverter 504A may be coupled to pass-through channel 520B to receive DC input 502B. Pass-through channel 520B may be coupled to pass-through channel 518B such that they act as a single pass-through channel for providing an avenue through which DC power may flow. Although FIG. 5 shows inverter 504A coupled to pass-through channel 520B to receive DC input 502B, it is to be appreciated that inverter 504A can be coupled to any of pass-through channels 520A-520C in other embodiments. Similarly, inverter 504B may be coupled to any of pass-through channels 518A-518C. In some embodiments, inverter 504A can be coupled to the same pass-through channel as inverter 504B such that DC input 502C is received by both inverters 504A and 504B. Two inverters may be utilized to convert DC power from a single DC source into AC power if the outputted DC power is too much for a single inverter to handle.

Pass-through channels 518A and 520A may be coupled to one another to provide a conductive path through which another inverter may couple to a DC source to receive DC input 502A. As an example, a third inverter (not shown) could be coupled to pass-through channels 520A and 518A to receive DC input 502A from another DC source. The third inverter chassis may attach to inverter chassis 501A the same way inverter chassis 501A is attached to inverter chassis 501B. DC input 502A may flow through pass-through channels 520A and 518A and be outputted by inverter chassis 501A as DC output 532A from DC outlet 522 of inverter chassis 501A. DC output 532A may be inputted into the third chassis and be converted by a third inverter. More pass-through channels may enable more DC sources to couple with inverters in the inverter stack.

Like pass-through channels 518A-518C and 520A-520C, common AC busses 528A and 528B may also be coupled to one another in similar fashion to allow power to flow between inverter chassis 501A and 501B. In embodiments with a third inverter, the third inverter may be coupled to inverter chassis 501A and output AC power into common AC buses 528A and 528B as AC input 534. AC input 534 may be combined with AC power outputted by inverters 504A and 504B and outputted as a collective whole to a load or a utility grid as AC output 530.

In embodiments, adjacent inverter chassis in an inverter stack may be fastened together to prevent inadvertent separation. For example, a locking mechanism (not shown) positioned at an interface between inverter chassis 501A and 501B may attach and fix them together. The locking mechanism may be any suitable mechanical contraption configured to fix two structures together. Exemplary locking mechanisms include clamps, hooks, screws, pins, and the like. One exemplary locking mechanism may be a threaded inlet and outlet for each inverter chassis where each inlet may be threaded to fasten to a respective outlet, and vice versa. Inverter chassis 501A and 501B are illustrated as having protruding inlets and recessed outlets; however, it is to be appreciated that such illustrations are for ease of discussion and are not intended to be limiting. Other embodiments may have protruding inlets and outlets, recessed inlets and outlets, or inlets and outlets that neither protrude nor recess from the inverter chassis.

2. Coupling by Adapters

Figure 6:
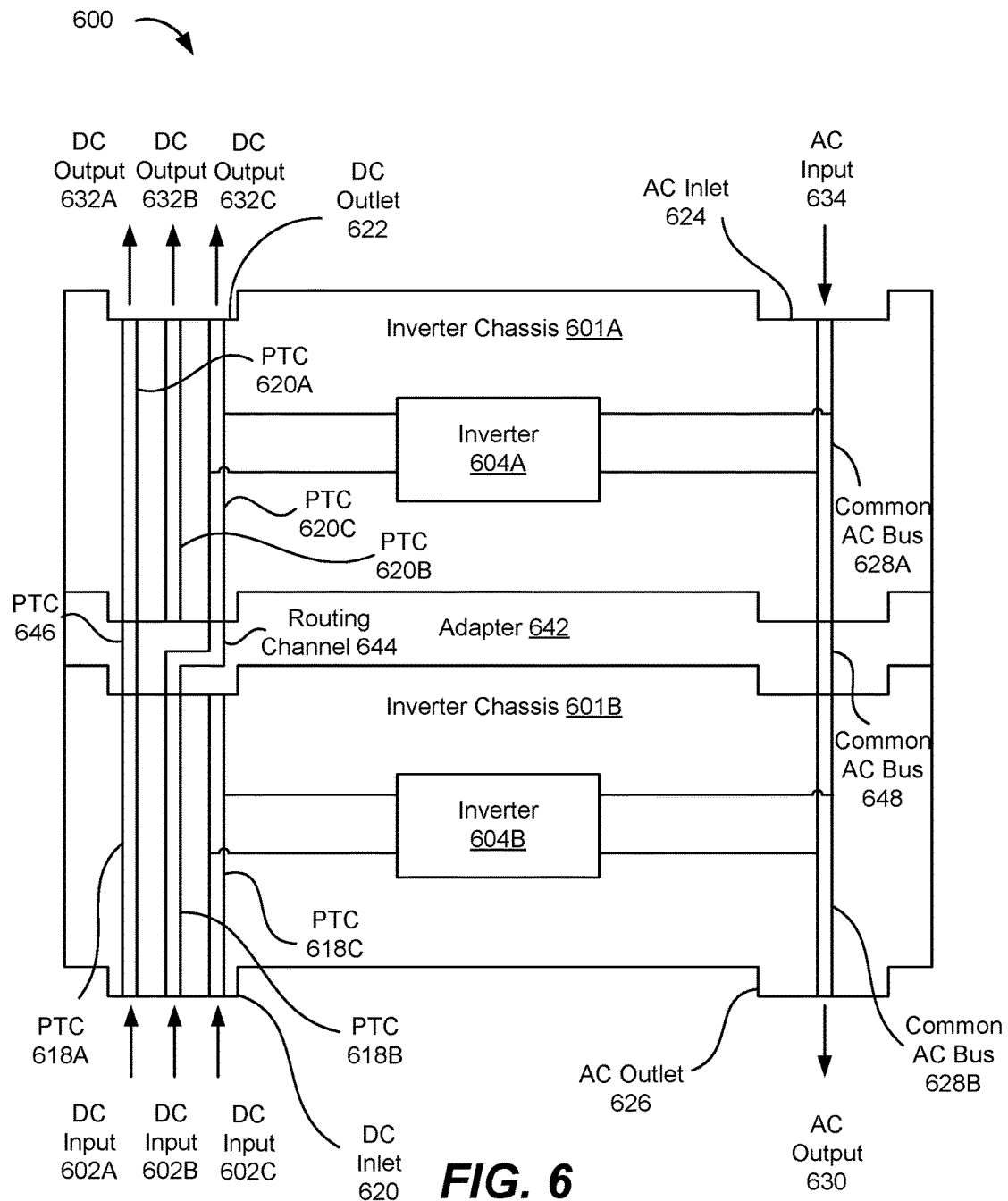
FIG. 6 is a simplified block diagram illustrating a modular inverter stack where inverters are coupled to respective pass-through channels through an adapter, according to embodiments of the present invention.

Although FIG. 5 illustrates inverter chassis 501A and 501B directly coupled to one another, embodiments are not limited to such configurations. FIG. 6 illustrates an exemplary inverter stack 600 where inverter chassis 601A and 601B are coupled to one another through adapter 642 according to embodiments of the present invention. Adapter 642 may be an intermediary structure that is configured to electrically and physically couple two inverter chassis together. As shown in FIG. 6, adapter 642 may include routing channel 644. Routing channel 644 may change the route of power across different pass-through channels from a route that would have been established without adapter 642. For instance, without adapter 642, DC input 602B would flow through pass-through channels 618B and 620B. Incorporating adapter 642 causes routing channel 644 to route DC input 602B from pass-through channel 618B to pass-through channel 620C instead. Thus, inverter 604A may receive DC input 602B from pass-through channel 620C.

In addition to routing channel 644, adapter 642 may include one or more pass-through channels, such as pass-through channel 646, and common AC bus 648 to enable inverter chassis coupled to one end of adapter 642 to send and/or receive power from devices coupled to the opposite end of adapter 642. Similar to pass-through channels 618A-618C, pass-through channel 646 and common AC bus 648 may be formed of any suitable power routing mechanism, such as a pair of positive and negative conductive lines on a PCB with corresponding contacts at either end of the conductive lines, electrically isolated positive and negative wires with corresponding contacts at either end of the wires, or conduits through which electrically isolated positive and negative wires may be threaded.

Using adapter 642 enables inverter chassis 601A and 601B to be interchangeable, meaning inverter chassis 601A may have the same structure and configuration as inverter chassis 601B. Having interchangeable inverters greatly simplifies installation of the inverter stack for a PV system.

3. Coupling by Manual Switches

Other inverter configurations may also simplify the installation process. As an example, inverter configurations incorporated with manual switches may help simplify the installation process. In such configurations, each inverter chassis may include a manual switch for coupling an inverter to any one of a plurality of pass-through channels. As a result, an adapter may not be needed to form a modular inverter stack for a PV system.

Figure 7:
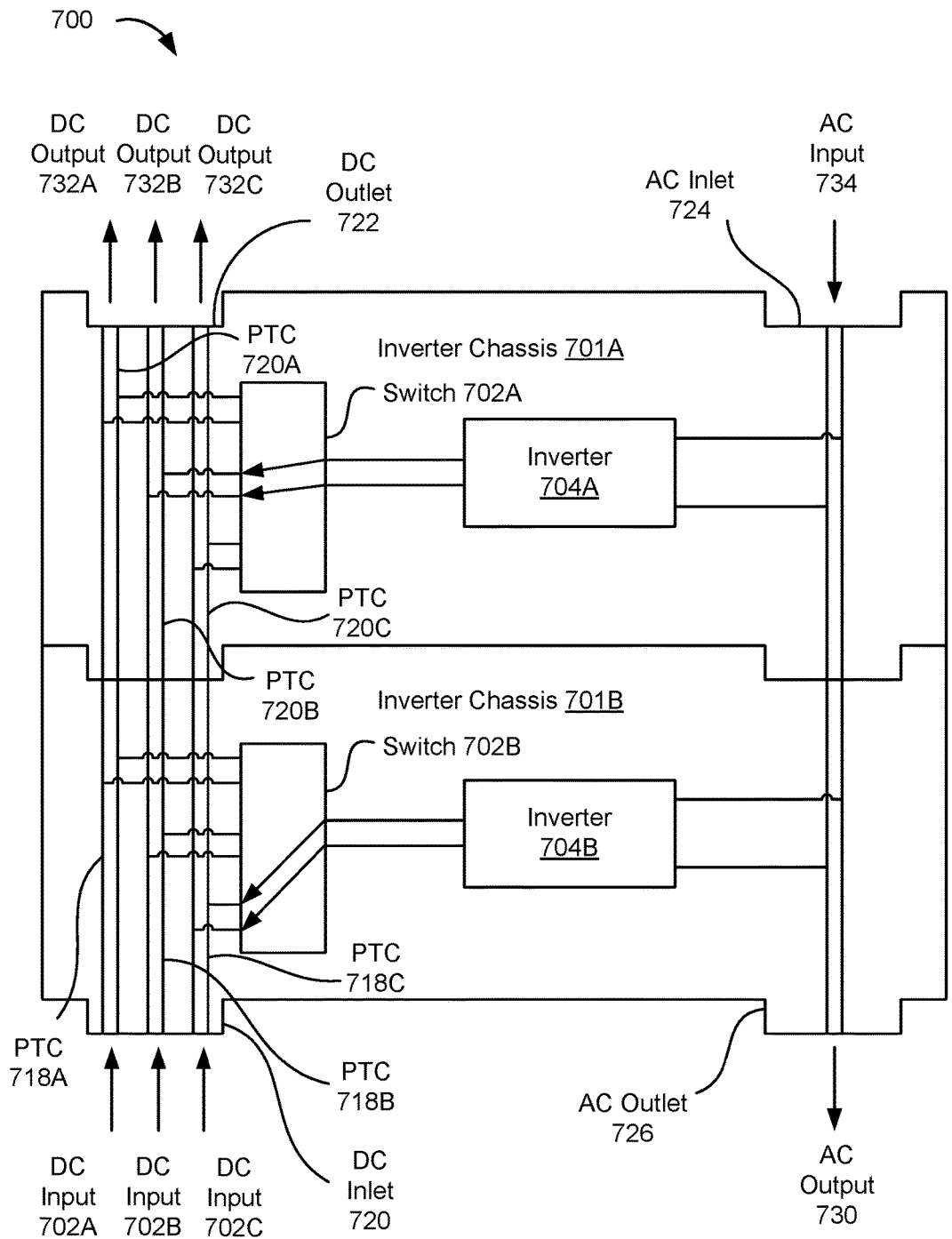
FIG. 7 is a simplified block diagram illustrating a modular inverter stack where inverters are coupled to respective pass-through channels through a manual switch, according to embodiments of the present invention.

FIG. 7 illustrates exemplary inverter stack 700 where inverters are coupled to pass-through channels by a manual switch according to embodiments of the present invention. In the exemplary inverter stack 700, switches 702A and 702B may each be a three-position switch that is configured to select between pass-through channels 720A-720C and 718A-718C, respectively. The number of positions for switches 702A and 702B may depend upon the number of pass-through channels. In embodiments, the number of positions is at least equal to the number of pass-through channels. With reference to the embodiment shown in FIG. 7, switch 702A may have three positions for coupling to three pass-through channels 720A-720C.

Depending on their position, switches 702A and 702B may couple inverters 704A and 704B to respective pass-through channels. For instance, switch 702A may be flipped to a second position to couple inverter 704A to pass-through channel 720B to receive DC input 702B, as shown in FIG. 7. On the other hand, switch 702B may be flipped to a first position to couple inverter 704B to pass-through channel 718C to receive DC input 702C. Accordingly, incorporating manual switches in inverter chassis 701A and 701B for an inverter stack enables DC sources to be easily coupled to the appropriate inverters.

Switches 702A and 702B may be any suitable manual switch. As an example, switches 702A and 702B may be double pole N-throw switches (where N corresponds with the number of pass-through channels), relays, rotary switches, toggle switches, and any other suitable switch capable of coupling an output with two or more inputs. Such manual switches enable a person, such as an installer of a PV system, to set the position of switches 702A and 702B by simply moving a lever, pushing a button, or turning a knob, thereby significantly enhancing the ease and flexibility of installing inverters for PV systems.

4. Coupling by Computer Operable Switches

Installation and configuration of inverter systems may be further simplified by implementing computer operable switches. In such systems, each inverter chassis may include a computer operable switch for coupling an inverter to any one of a plurality of pass-through channels. The computer operable switch may include a plurality of switches for coupling an inverter to a specific pass-through channel for receiving DC input. A controller may operate the computer operable switch according to an algorithm and/or according to an input to establish a connection between an inverter and a pass-through channel. As a result, a person does not have to manually flip a switch to install a modular inverter stack for a PV system.

Figure 8:
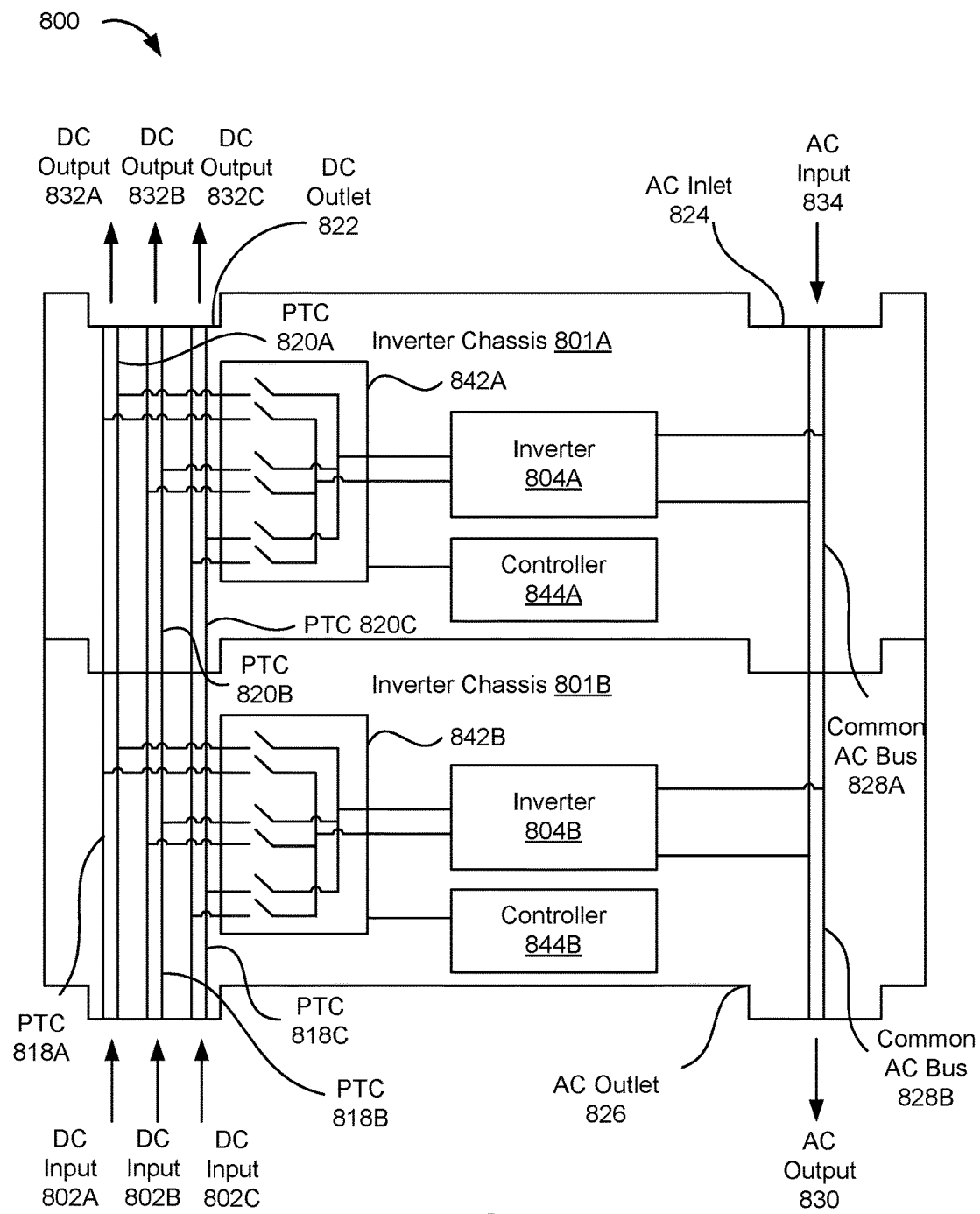
FIG. 8 is a simplified block diagram illustrating a modular inverter stack where inverters are coupled to respective pass-through channels through a computer-operable switch, according to embodiments of the present invention.

FIG. 8 illustrates an exemplary inverter stack 800 for an inverter system with computer operable switches 842A and 842B according to embodiments of the present invention. Computer operable switches 842A and 842B may be disposed between respective inverters 804A and 804B and pass-through channels 820A-820C and 818A-818B, and may be formed of a plurality of switches arranged in pairs that correspond to positive and negative terminals for establishing power connections.

Each pair of switches may be independently controlled by a controller (e.g., controller 844A or 844B) and can be activated to close a switch to route power from any one of pass-through channels 820A-820C and 818A-818C to respective inverters 804A and 804B. Each switch of the plurality of switches can be an electrical switch such as a transistor (e.g., MOSFET, BJT, etc.). Controllers 844A and 844B may be any suitable electronic device that can be configured to operate switches 842A and 842B to couple inverters 804A and 804B with a desired pass-through channel. Exemplary electronic devices include, but are not limited to, microcontrollers, application-specific integrated circuits (ASIC), field-programmable gate arrays (FPGA), programmable logic boards, and the like.

In embodiments, controllers 844A and 844B can be configured to automatically couple inverters 804A and 804B to the correct pass-through channel for receiving DC input from a DC source by communicating with a wire box (not shown, but described in detail further herein). A communication device in the wire box may send a signal to controllers 844A and 844B indicating which switch to close. The wire box may know the arrangement of inverters in the inverter stack and the arrangement of DC sources so that it can send signals to respective controllers to couple the correct inverters with the correct pass-through channels. All of this can be performed without user intervention, thereby saving time and cost during installation of a PV system.

C. Wire Box

Figure 9:
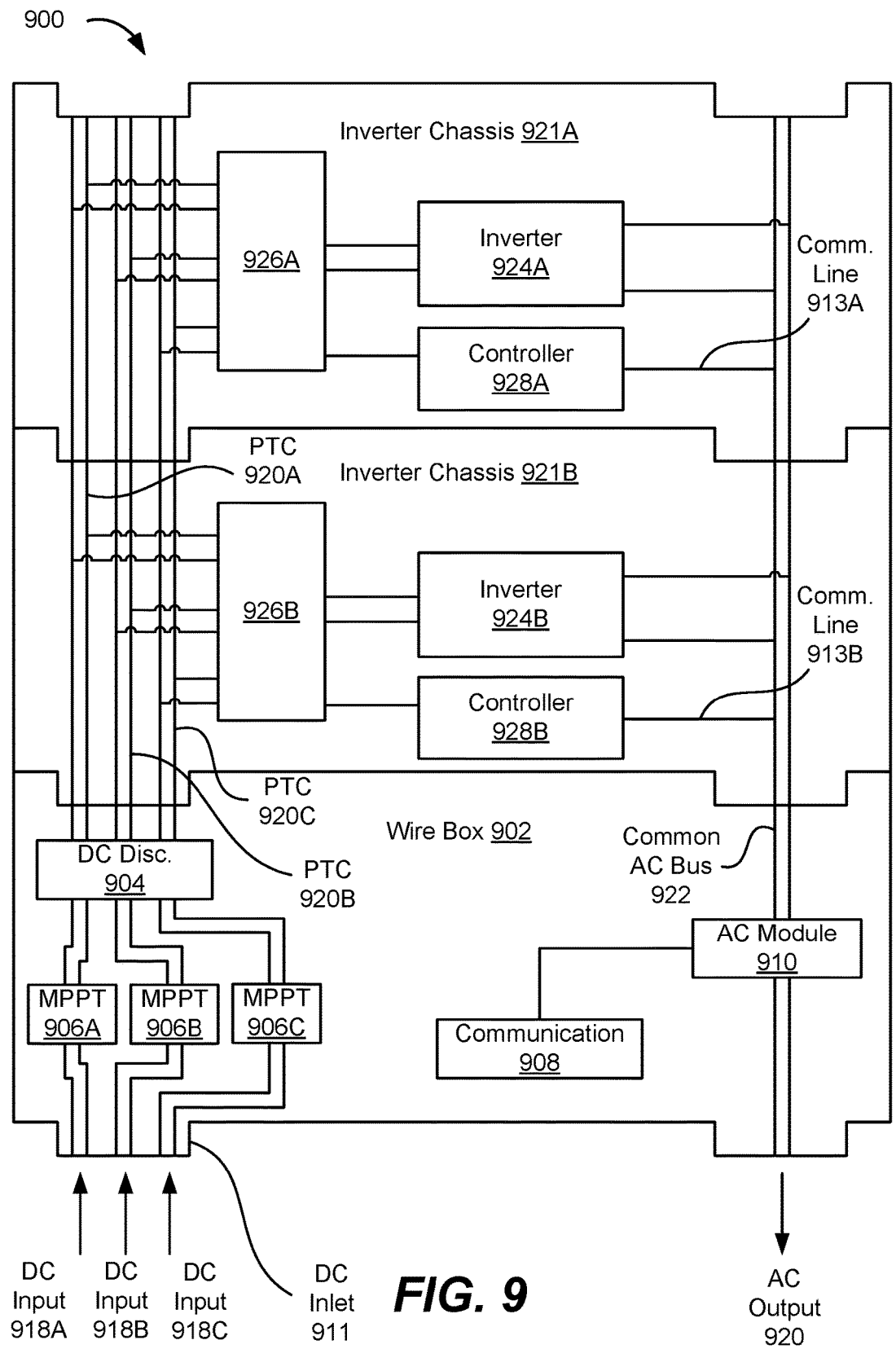
FIG. 9 is a simplified block diagram illustrating a modular inverter stack including a wire box, according to embodiments of the present invention.

FIG. 9 is a simplified diagram illustrating an exemplary modular inverter system 900 with a wire box 902 according to embodiments of the present invention. Wire box 902 may include various electrical components for managing interactions between the DC power sources and the inverter stack, Wire box 902 may be disposed between the inverter stack and the DC sources.

In embodiments, wire box 902 may include one or more maximum power point tracking (MPPT) devices 906A-906B for maximizing power output of DC sources. Such devices 906A-906B may comprise circuit boards, integrated circuits or other hardware and software as is known in the art. Typically, MPPT devices are disclosed within inverter chassis; however, according to embodiments herein, MPPT devices may be disposed within wire box 902. DC power may flow into wire box 902 from the DC power sources through DC inlet 911 and be received by respective MPPTs 906A-906B, which may output maximized power through DC disconnect 904 and into respective pass-through channels 920A-920C to be received by inverters in the inverter stack for the modular inverter system 900 through switches 926A and 926B. DC disconnect 904 may be formed of one or more manual switches that can shut off the flow of power between the respective DC power sources and inverters 924A and 924B in the inverter stack.

Wire box 902 may also include communication module 908 for communicating with controllers 928A and 928B in the modular inverter system to control switches 926A and 926B. Similar to controllers 928A and 928B, communication module 908 may be a microcontroller, an ASIC, a FPGA, a programmable logic board, or the like. Communication module 908 may communicate with controllers 928A and 928B by any suitable transmission method, such as radio frequency (RF) transmission, Bluetooth, wireless fidelity (WiFi), AC or DC power line communication (PLC), and the like. AC module 910 may be implemented in wire box 902 to perform AC PLC to controllers 928A and 928B. To enable AC PLC, controllers 928A and 928B may be coupled to common AC bus 922 by respective communication lines 913A and 913B to receive communication signals from AC module 910.

In embodiments, communication module 908 may determine the number of DC sources and the magnitude of their respective power outputs by interacting with MPPTs 906A-906B. Communication module 908 may also determine the arrangement of inverters in the inverter stack by communicating with controllers 928A and 928B. Once the DC sources and the available inverters are determined, communication module 908 may determine a connection arrangement between inverters 924A and 924B and the DC sources and then cause switches 926A and 926B to implement the connection arrangement by altering their switch positions to couple to the correct pass-through channel. The coupling of inverters 924A and 924B to corresponding DC sources may be performed automatically without user intervention.

What is claimed is:

1. A photovoltaic (PV) power generation apparatus, comprising:
   a wire box coupled to an alternating current (AC) system through an AC bus and to both a first direct current (DC) power source and a second DC power source;
   a first inverter having a first chassis attached to the wire box and being coupled to the first DC power source through the wire box, the first inverter comprising a first pass-through channel and a second pass-through channel electrically isolated from the first pass-through channel, wherein the first inverter is configured to convert DC power generated from the first DC power source into AC power that is outputted into the AC bus; and a second inverter having a second chassis attached to the first chassis and being coupled to the second DC power source through the first pass-through channel and the wire box, the second inverter comprising a third pass-through channel configured to allow a third inverter to be coupled to the wire box through the third pass-through channel and the second pass-through channel, wherein the second inverter is configured to convert DC power generated from the second DC power source via the first pass-through channel into AC power that is outputted into the AC bus, and wherein the first chassis and the second chassis are separate chassis and are stackable.

2. The photovoltaic power generation apparatus of claim 1, wherein the second and third pass-through channels form a single pass-through channel.

3. The photovoltaic power generation apparatus of claim 1, wherein the first, second, and third pass-through channels are formed of conductive lines on a PCB having contacts disposed at opposite ends of each conductive lines.

4. The photovoltaic power generation apparatus of claim 3, wherein the conductive lines comprise a positive and a negative conductive line.

5. The photovoltaic power generation apparatus of claim 1, wherein the first, second, and third pass-through channels are formed of separate, electrically-insulated conductive wires having contacts disposed at opposite ends of each conductive wire.

6. The photovoltaic power generation apparatus of claim 1, wherein the second pass-through channel is formed of a conductive wire that runs through corresponding holes in the first chassis.

7. The photovoltaic power generation apparatus of claim 1, further comprising an adapter disposed between the first chassis and the second chassis, the adapter configured to route DC power from the first pass-through channel to the second inverter and from the second-pass-through channel to the third pass-through channel.

8. The photovoltaic power generation apparatus of claim 1, wherein the first chassis has a first direct current (DC) inlet, a first DC outlet, a first AC inlet and a first AC outlet, and the second chassis has a second DC inlet, a second DC outlet, a second AC inlet, and a second AC outlet.

9. The photovoltaic power generation apparatus of claim 8, wherein the first pass-through channel is coupled to the first DC inlet and the first DC outlet.

10. The photovoltaic power generation apparatus of claim 8, wherein DC power flows into the first chassis from the first DC power source through the first DC inlet, and wherein AC power flows out of the first chassis from the first AC outlet.

11. The photovoltaic power generation apparatus of claim 8, wherein DC power flows into the second chassis from the second DC power source through the second DC inlet, and wherein AC power flows out of the second chassis from the second AC outlet.

12. The photovoltaic power generation apparatus of claim 1, wherein the first and second chassis include a switch for coupling first and second inverters to first and second DC power sources, respectively.

13. The photovoltaic power generation apparatus of claim 12, wherein the switch is a manual switch or a computer-controlled switch.

14. The photovoltaic power generation apparatus of claim 1, wherein first and second chassis are field configurable.

15. A photovoltaic (PV) power generation system, comprising:

a PV array having an electrical output divided into first direct current (DC) power source and a second DC power source; and a modular inverter system comprising:

a wire box coupled to an alternating current (AC) system through an AC bus and to both the first DC power source and the second DC power source;

a first inverter having a first chassis attached to the wire box and being coupled to the first DC power source through the wire box, the first inverter comprising a first pass-through channel and a second pass-through channel separate from the first pass-through channel, wherein the first inverter is configured to convert DC power generated from the first DC power source into AC power that is outputted into the AC bus; and a second inverter having a second chassis attached to the first chassis and being coupled to the second DC power source through the first pass-through channel and the wire box, the second inverter comprising a third pass-through channel configured to allow a third inverter to be coupled to the wire box through the third pass-through channel and the second pass-through channel, wherein the second inverter is configured to convert DC power generated from the second DC power source into AC power that is outputted into the AC bus, and wherein the first chassis and the second chassis are separate chassis and are stackable.

16. The system of claim 15, wherein the first, second, and third pass-through channels are formed of conductive lines on a PCB having contacts disposed at opposite ends of each conductive lines.

17. The system of claim 15, wherein the first, second, and third pass-through channels are formed of separate, electrically-insulated conductive wires having contacts disposed at opposite ends of each conductive wire.

18. The system of claim 15, further comprising an adapter disposed between the first chassis and the second chassis, the adapter configured to route DC power from the first pass-through channel to the inverter and from the second-pass-through channel to the third pass-through channel.

19. A method for converting power for an energy generation system, comprising:

receiving, at a wire box, first and second DC power inputs;

performing maximum power point tracking (MPPT) with respective first and second MPPT circuits on the first and second power inputs;

connecting an output of the first MPPT circuit to a first DC inlet of a first inverter chassis;

inverting the output of the first MPPT circuit with a first inverter in the first inverter chassis;

connecting an output of the second MPPT circuit to a first pass-through circuit of the first inverter chassis;

receiving, at a second DC inlet of a second inverter chassis, the DC power from the first pass-through channel in the first inverter chassis;

inverting the output of the second MPPT circuit with a second inverter in the second inverter channel; and routing the DC power through at least a portion of a second pass-through channel in the second inverter chassis to an inverter in the second inverter chassis.

20. The method of claim 19, further comprising combining the output of the first and second inverters onto a common AC bus that is also connected to a terminal in the wire box.

\* \* \* \* \*